United States Patent
Hsu et al.

(10) Patent No.: US 9,087,981 B2
(45) Date of Patent: Jul. 21, 2015

(54) METHODS OF FORMING A MAGNETIC TUNNEL JUNCTION DEVICE

(71) Applicant: Taiwan Semiconductor Manufacturing Company, Ltd., Hsin-Chu (TW)

(72) Inventors: Chern-Yow Hsu, Chu-Bei (TW); Shih-Chang Liu, Alian Township (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 76 days.

(21) Appl. No.: 13/763,293

(22) Filed: Feb. 8, 2013

(65) Prior Publication Data

US 2014/0227801 A1 Aug. 14, 2014

(51) Int. Cl.
*H01L 21/00* (2006.01)
*H01L 43/12* (2006.01)
(52) U.S. Cl.
CPC ...................................... *H01L 43/12* (2013.01)
(58) Field of Classification Search
CPC .......... H01L 43/12; H01L 43/02; H01L 43/10
USPC ............................................................ 438/3
See application file for complete search history.

(56) References Cited

U.S. PATENT DOCUMENTS

| | | | |
|---|---|---|---|
| 6,965,138 B2 | 11/2005 | Nakajima et al. | |
| 7,993,535 B2 | 8/2011 | Jiang et al. | |
| 2009/0078927 A1 | 3/2009 | Xiao et al. | |
| 2010/0219493 A1 | 9/2010 | Li | |
| 2010/0258886 A1 | 10/2010 | Wang et al. | |
| 2011/0089507 A1 | 4/2011 | Mao | |
| 2011/0256642 A1 | 10/2011 | Matsui et al. | |
| 2012/0028373 A1 | 2/2012 | Belen et al. | |
| 2013/0119494 A1 | 5/2013 | Li et al. | |
| 2014/0227802 A1 | 8/2014 | Hsu et al. | |
| 2014/0227804 A1 | 8/2014 | Hsu et al. | |

*Primary Examiner* — Richard Booth
(74) *Attorney, Agent, or Firm* — Slater & Matsil, L.L.P.

(57) ABSTRACT

Embodiments of the present disclosure are a method of forming a magnetic tunnel junction (MTJ) device and methods of forming a magnetic random access memory (MRAM) device. An embodiment is a method of forming a magnetic tunnel junction (MTJ) device, the method comprising forming an MTJ layer over a bottom electrode, forming a top electrode layer over the MTJ layer, and selectively etching the top electrode layer to form a top electrode over the MTJ layer. The method further comprises patterning an upper portion of the MTJ layer with an ion beam etch (IBE) process.

20 Claims, 5 Drawing Sheets

METHODS OF FORMING A MAGNETIC TUNNEL JUNCTION DEVICE

BACKGROUND

Semiconductor storage devices are used in integrated circuits for electronic applications, including radios, televisions, cell phones, and personal computing devices. Commonly known storage devices include charge-storing devices such as dynamic random access memories (DRAMs) and flash memories.

A more recent development in storage devices involves spin electronics, which combine semiconductor technology and magnetic materials. The spin polarization of electrons, rather than the charge of the electrons, is used to indicate the state of "1" or "0." One such spin electronic device is a spin torque transfer (STT) magnetic tunneling junction (MTJ) device.

Generally, an MTJ device includes free layer, pinned layer, and a tunnel layer interposed between the free layer and the pinned layer. The magnetization direction of the free layer can be reversed by applying a current through the tunnel layer, which causes the injected polarized electrons within the free layer to exert spin torques on the magnetization of the free layer. The pinned layer has a fixed magnetization direction. When current flows in the direction from the free layer to the pinned layer, electrons flow in a reverse direction, that is, from the pinned layer to the free layer. The electrons are polarized to the same magnetization direction of the pinned layer after passing the pinned layer, flowing through the tunnel layer, and then into and accumulating in the free layer. Eventually, the magnetization of the free layer is parallel to that of the pinned layer, and the MTJ device will be at a low resistance state. The electron injection caused by current is referred to as a major injection.

When current flowing from the pinned layer to the free layer is applied, electrons flow in the direction from the free layer to the pinned layer. The electrons having the same polarization as the magnetization direction of the pinned layer are able to flow through the tunnel layer and into the pinned layer. Conversely, electrons with a polarization differing from the magnetization of the pinned layer will be reflected (blocked) by the pinned layer, and will accumulate in the free layer. Eventually, magnetization of the free layer becomes anti-parallel to that of the pinned layer, and the MTJ device will be at a high-resistance state. The respective electron injection caused by current is referred to as a minor injection.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
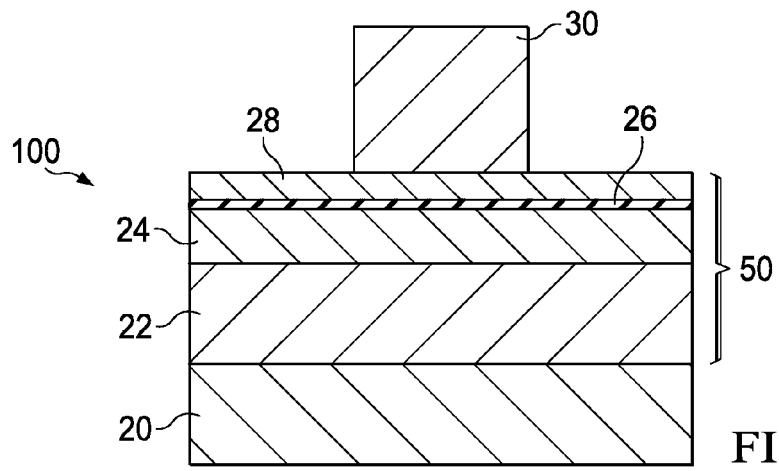
FIGS. 1 through 7 illustrate intermediate stages of forming a magnetic tunnel junction (MTJ) device in accordance with an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a method for forming a magnetic tunnel junction (MTJ) device with improved performance and electrical characteristics. Other embodiments may also be applied, however, to other methods of forming semiconductor devices such as a magnetic random access memory (MRAM) device.

Figure 9:
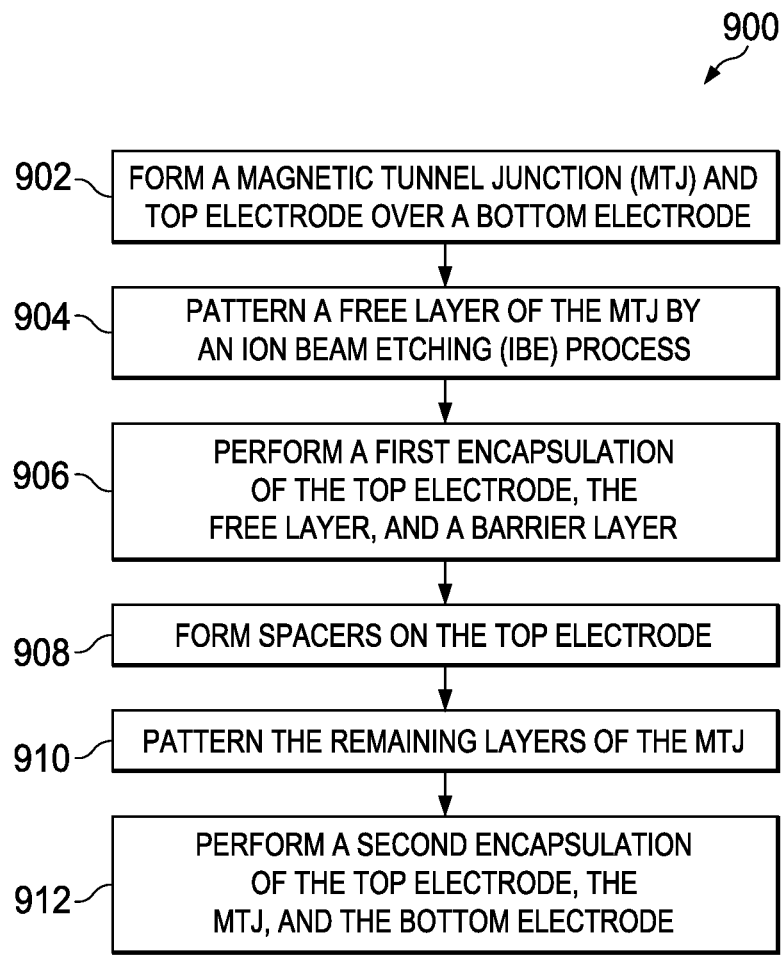
FIG. 9 illustrates a flow diagram of a method for manufacturing an MTJ device in accordance with an embodiment.

FIG. 9 illustrates a flow diagram of a method 900 for manufacturing a MTJ device in accordance with an embodiment. While method 900 is illustrated and described below as a series of acts or events, it will be appreciated that the illustrated ordering of such acts or events are not to be limited to a particular embodiment. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 902, an MTJ layer and a top electrode are formed over a bottom electrode. Step 902 is illustrated in FIG. 1 as described below.

With reference now to FIG. 1, there is shown an MTJ device 100 at an intermediate stage of manufacturing. The MTJ device 100 includes a bottom electrode 20, an MTJ 50 over the bottom electrode 20, and a top electrode 30 over the MTJ 50. The MTJ 50 may also be referred to as an MTJ layer and comprises an anti-ferromagnetic material (AFM) layer 22 over the bottom electrode 20, a pinned layer 24 over the AFM layer 22, a barrier layer 26 over the pinned layer 24, and a free layer 28 over the barrier layer 26.

The bottom electrode 20 may be formed in a dielectric layer (not shown) by a suitable process, including a damascene process. Other processes, such as deposition and etching, dual damascene, and the like, may also be used. The bottom electrode 20 may be formed of any suitable conductive material, such as a highly-conductive, low-resistive metal, elemental metal, transition metal, or the like, including metals or metal alloys including one or more of Al, AlCu, Cu, Ta, TaN, Ti, TiN, W, polysilicon, the like, or a combination thereof. The bottom electrode 20 may include a barrier/adhesion layer (not shown) to prevent diffusion and provide better adhesion between the bottom electrode 20 and the surrounding dielectric layers (not shown). The bottom electrode 20 may be formed, for example, by chemical vapor deposition (CVD), physical vapor deposition (PVD), atomic layer deposition (ALD), spin-on deposition, or other suitable methods.

The AFM layer 22 may be formed over the bottom electrode 20. The AFM layer 22 may be formed of PtMn, IrMn, the like, or a combination thereof. The AFM layer 22 may be deposited through a process such as CVD, PVD, ALD, the like, or a combination thereof to a thickness between about 80 Å and about 200 Å.

The pinned layer 24 may be formed over the AFM layer 22. The pinned layer 24 may be formed of any suitable ferromagnetic material or alloys that include iron such as CoFe, CoFeB, the like, or a combination thereof. The pinned layer 24 may also be formed of composite layers such as CoFeB/Ru/CoFeB/PtMn, the like, or a combination thereof. The pinned layer 24 may be deposited through a process such as CVD, PVD, ALD, the like, or a combination thereof to a thickness between about 30 Å and about 60 Å.

The barrier layer 26 may be formed over the pinned layer 24. The barrier layer 26 may be formed of any suitable dielectric material such as MgO, aluminum oxides (AlOx or $Al_2O_3$), the like, or a combination thereof. The barrier layer 26 may be deposited through a process such as CVD, PVD, ALD, the like, or a combination thereof to a thickness between about 1 Å and about 55 Å.

The free layer 28 may be formed over the barrier layer 26. The free layer 28 may be formed of any suitable ferromagnetic material or alloys that include iron such as CoFe, CoFeB, the like, or a combination thereof. The free layer 28 may also be formed of composite layers such as CoFeB/Ru/CoFeB/PtMn, the like, or a combination thereof. The free layer 28 may be deposited through a process such as CVD, PVD, ALD, the like, or a combination thereof to a thickness between about 10 Å and about 30 Å.

The pinned layer 24 is a ferromagnetic layer whose magnetic orientation may not be changed during operation of its associated MTJ device 100. The free layer 28 is also a ferromagnetic layer whose magnetic polarity or magnetic orientation can be changed during write operation of its associated MTJ device 100. The relative alignment of the magnetic fields of the pinned layer 24 and free layer 28 determines the resistive state (high resistance or low resistance) of the barrier layer 26 interposed between the pinned layer 24 and free layer 28. Digital information stored in an MTJ 50 is read by detecting the resistive state of the MTJ 50.

When the magnetic orientations of the free layer 28 and pinned layer 24 are anti-parallel to each other, a first memory state exists (e.g., a logical '1'). When the magnetic orientations of the free layer 28 and pinned layer 24 are parallel to each other, a second memory state exists (e.g., a logical '0'). The magnetic orientation of the free layer 28 and pinned layer 24 can be sensed to read data stored in the MTJ 50 by sensing the resistance when current flows through the MTJ 50. To change the state of the MTJ 50, the magnetic polarity of the free layer 28 is altered by applying current to the free layer 28 to switch the magnetization of the free layer 28.

The top electrode 30 may be formed in a dielectric layer (not shown) by a suitable process, including a damascene process. Other processes, such as deposition and etching, dual damascene, and the like, may also be used. The top electrode 30 may be formed of any suitable conductive material, such as a highly-conductive, low-resistive metal, elemental metal, transition metal, or the like, including metals or metal alloys including one or more of Al, AlCu, Cu, Ta, TaN, Ti, TiN, W, polysilicon, the like, or a combination thereof. The top electrode 30 may include a barrier/adhesion layer (not shown) to prevent diffusion and provide better adhesion between the top electrode 30 and the surrounding dielectric layers (not shown). The top electrode 30 may be formed, for example, by CVD, PVD, ALD, spin-on deposition, or other suitable methods. The locations and the shapes of the top electrode 30 and the bottom electrode 20 are provided for illustrative purposes only and are not limiting.

Figure 2A:
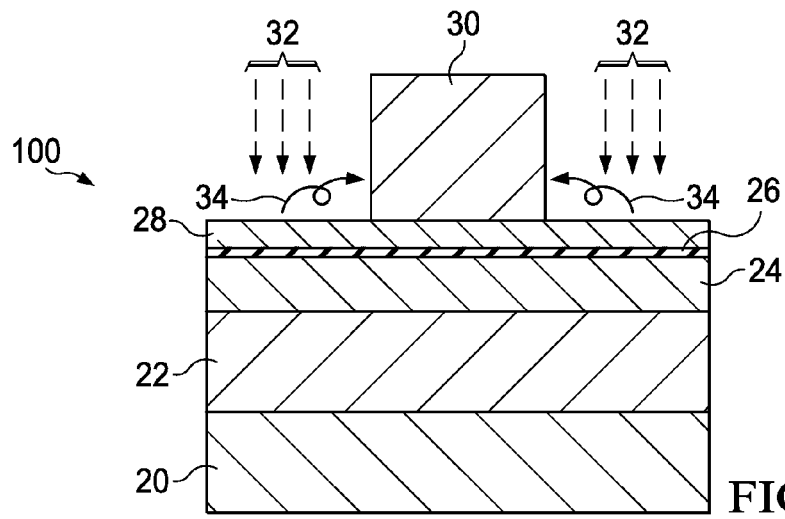
Figure 2B:
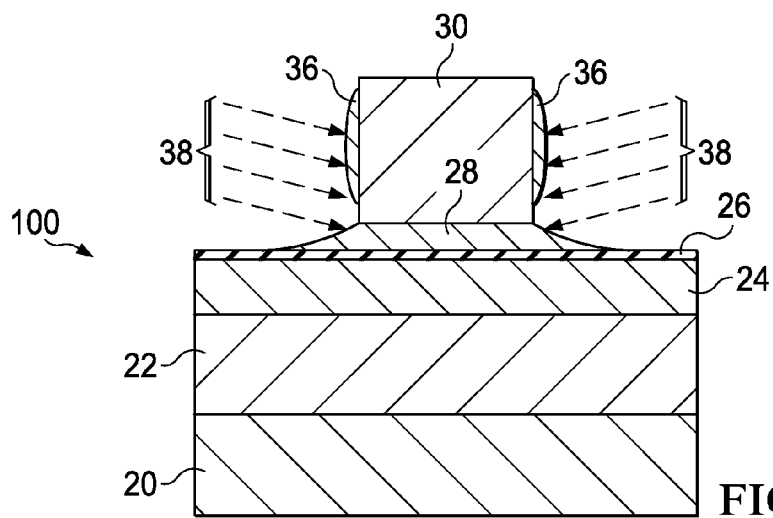
Figure 2C:
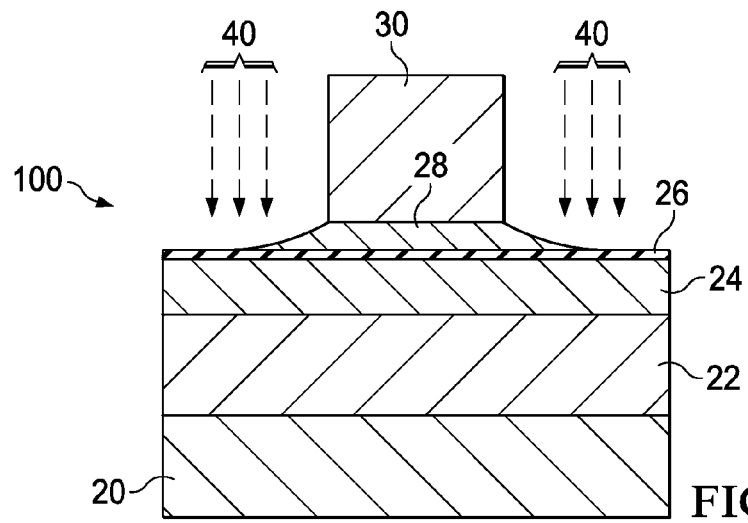

At step 904 of FIG. 9, the free layer 28 of the MTJ 50 may be patterned by an ion beam etching (IBE) process. In an embodiment, step 904 is illustrated in FIGS. 2A through 2C and will be discussed below in reference to FIG. 10. In another embodiment, step 904 is illustrated in FIG. 3.

Figure 3:
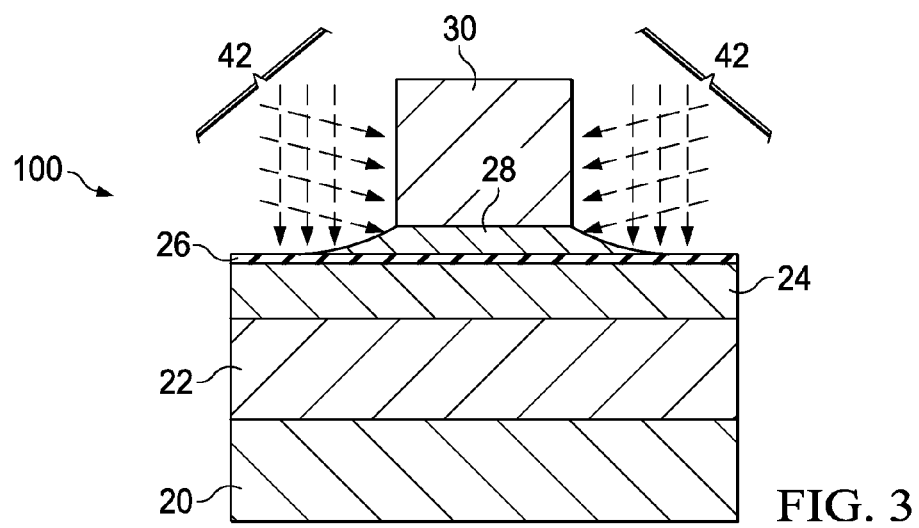

With reference to FIG. 3, the free layer 28 is patterned by an IBE process 42. The IBE process 42 may comprise an etchant gas such as a CHF series ($CHF_2$, $CHF_3$, or $CHF_4$), Ar, O, N, the like, or a combination thereof. The angle of incidence of the ions during the IBE process 42 may be controlled and modified to etch the free layer 28 to have a width substantially the same as the top electrode 30. The IBE process 42 may have an end point detection system (not shown) to allow the etching process to stop on the barrier layer 26. Further, the IBE process 42 generates a neutralization species as the etchant and will not damage and/or oxidize the top electrode 30 and the sidewalls of the free layer 28.

The IBE process 42 may be performed in a chamber with a rotatable stage or substrate table with more than one axis of rotation. This rotation allows a more uniform etch profile and allows control of the angle of incidence of the ion beam. The ions may be extracted from the etchant gas, accelerated, and focused by one or more electrically biased grids. For example, a first grid with a voltage between about 100 V and about 200 V may extract the ion and accelerate it towards the substrate to be etched. A second grid with a voltage between about 500 V to about 2000 V may focus the trajectory of the ion with a third grid with a voltage between about 100 V and about 200 V preventing the ion from back-streaming to the second grid. In this example, the ion beam voltage would be the same as the voltage of the first grid.

At step 906 of FIG. 9, the top electrode 30, the free layer 28, and the barrier layer 26 are encapsulated. Step 906 is illustrated in FIG. 4 as described below.

Figure 4:
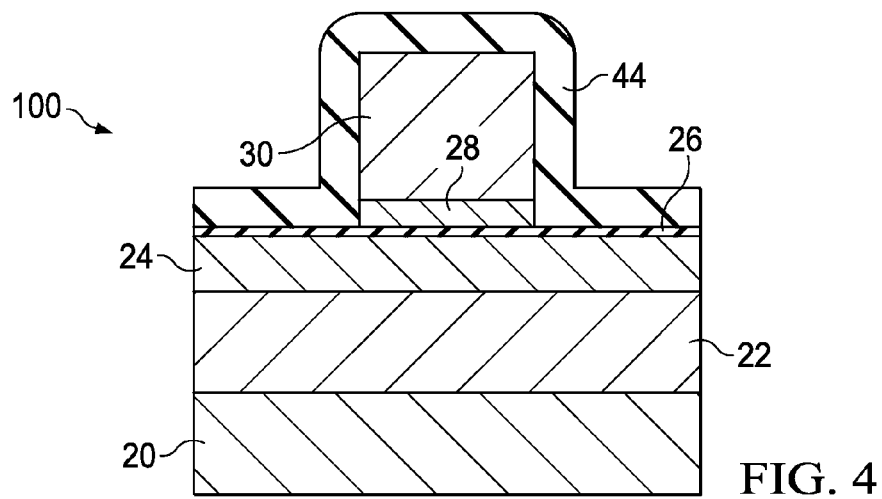

The top electrode 30, the free layer 28, and the barrier layer 26 may be encapsulated by a first dielectric layer 44 as illustrated in FIG. 4. The first dielectric layer 44 may be blanket deposited on the top electrode 30, the free layer 28, and the barrier layer 26. The first dielectric layer 44 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The first dielectric layer 44 may be deposited through a process such as CVD, or a spin-on-glass process, although any acceptable process may be utilized.

At step 908 of FIG. 9, spacers are formed on the top electrode 30. Step 908 is illustrated in FIG. 5 as described below.

Figure 5:
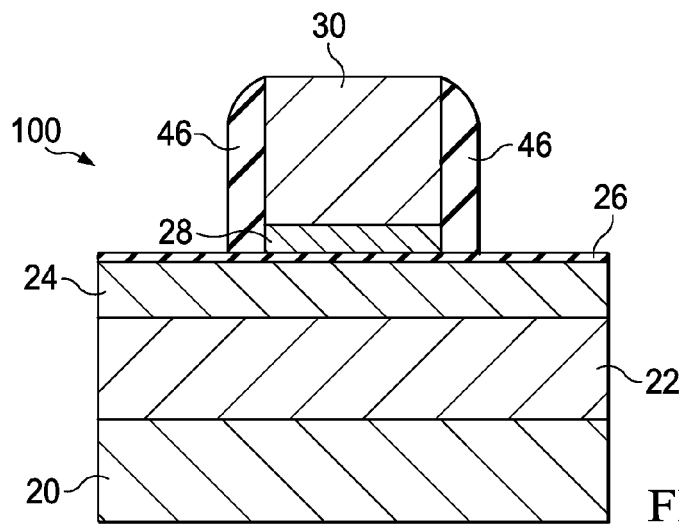

FIG. 5 illustrates the etching of the first dielectric layer 44 to form spacers 46. In an embodiment, the etching of the first dielectric layer 44 may be performed by, e.g., a dry etch, to remove the horizontal surfaces of the first dielectric layer 44 and form spacers 46. In another embodiment, the first dielectric layer 44 may be etched with etchant gas comprising $SF_6$, $CF_4$, $CHF_3$, the like, or a combination thereof.

At step 910 of FIG. 9, the barrier layer 26, the pinned layer 24, and the AFM layer 22 are patterned. Step 910 is illustrated in FIG. 6 as described below.

Figure 6:
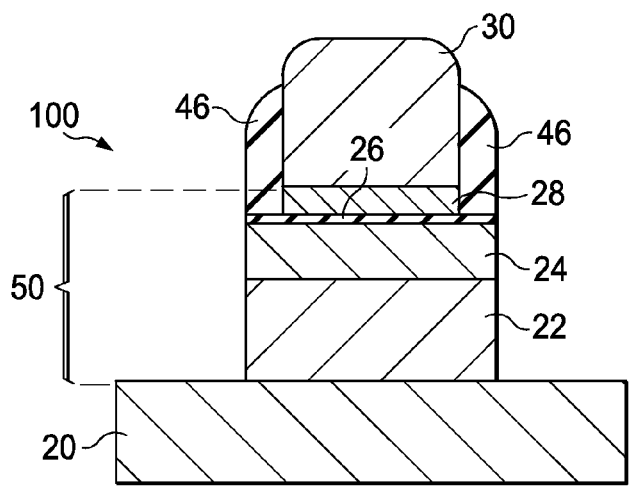

FIG. 6 illustrates the patterning of the barrier layer 26, the pinned layer 24, and the AFM layer 22. In an embodiment, the barrier layer 26, the pinned layer 24, and the AFM layer 22 may be patterned by an IBE process. The details of the IBE process may be similar to those described above in reference to FIG. 3, although the IBE processes need not be the same. The angle of incidence of the ions during the IBE process may be controlled and modified to etch the barrier layer 26, the pinned layer 24, and the AFM layer 22 to have sidewalls substantially aligned with the spacers 46. As described above, the IBE process may have an end point detection system to allow the etching process to stop on the bottom electrode 20 and the IBE process will not damage and/or oxidize the sidewalls of the barrier layer 26, the pinned layer 24, and the AFM layer 22.

At step 912 of FIG. 9, the top electrode 30, the MTJ 50, the spacers 46, and the bottom electrode 20 are encapsulated. Step 912 is illustrated in FIG. 7 as described below.

Figure 7:
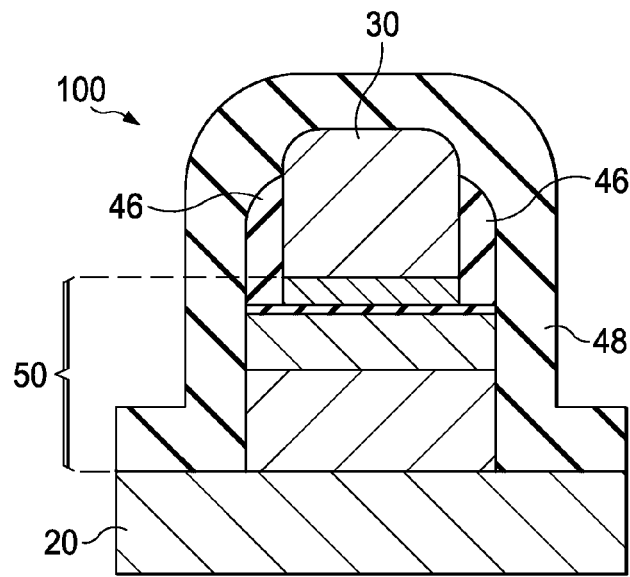

The top electrode 30, the MTJ 50, the spacers 46, and the bottom electrode 20 may be encapsulated by a second dielectric layer 48 as illustrated in FIG. 7. The second dielectric layer 48 may be blanket deposited on the top electrode 30, the free layer 28, and the barrier layer 26. The first dielectric layer 44 may be formed of similar materials and similar processes as the first dielectric layer 44, although the first dielectric layer 44 and the second dielectric layer 48 need not be formed of the same materials or by the same processes.

By performing an IBE process to pattern the MTJ 50, the damage, oxidation, and re-deposition of etch by-product on the sidewalls of the MTJ 50 may be prevented. This allows for a semiconductor device, for example, an MRAM device, to have improved performance and electrical characteristics.

In another embodiment, step 904 of FIG. 9 may be performed by a multi-step IBE process as illustrated in FIGS. 2A through 2C. The flow diagram for a multi-step IBE process is illustrated in FIG. 10 as described below.

Figure 10:
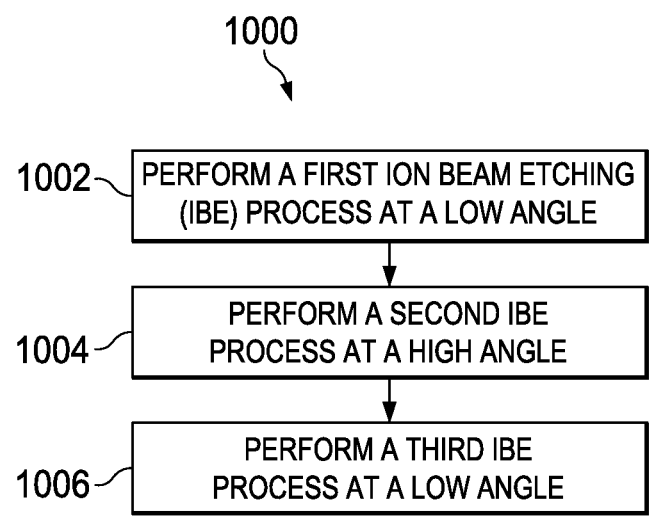
FIG. 10 illustrates a flow diagram of a method for a multi-step ion beam etching process in accordance with an embodiment.

FIG. 10 illustrates a flow diagram of a method 1000 for a multi-step IBE process in accordance with an embodiment. While method 1000 is illustrated and described below as a series of acts or events, it will be appreciated that the illustrated ordering of such acts or events are not to be limited to a particular embodiment. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 1002, a first IBE process 32 is performed at a low angle of incidence. Step 1002 is illustrated in FIG. 2A as described below.

FIG. 2A illustrates a first IBE process 32 at a low angle of incidence to pattern the free layer 28. The first IBE process 32 may cause the re-deposition of etch by-product 34 on the sidewalls of the top electrode 30 forming a top electrode film 36 (see FIG. 2B) on the sidewalls of the top electrode 30. The details of the first IBE process 32 may be similar to those described above in reference to FIG. 3, although the IBE processes need not be the same. In an embodiment, the angle of incidence of the ion beam as measured from a line orthogonal to a top surface of the barrier layer 26 may be between about 0° and about 25°.

At step 1004, a second IBE process 38 is performed at a high angle of incidence to pattern the free layer 28 and remove the top electrode film 36. Step 1004 is illustrated in FIG. 2B as described below.

FIG. 2B illustrates a second IBE process 38 at a high angle of incidence to further pattern the free layer 28 and to remove the top electrode film 36. The top electrode film 36 may impact the electrical behavior of the MTJ device 100 by causing, for example, increased resistance of the top electrode 30. The high angle of incidence of the ions during the second IBE process 38 may be controlled and modified to remove the top electrode film 36. As discussed above, the second IBE process 38 will not damage and/or oxidize the top electrode 30. The details of the second IBE process 38 may be similar to those described above in reference to FIG. 3, although the IBE processes need not be the same. In an embodiment, the angle of incidence of the ion beam as measured from a line orthogonal to a top surface of the barrier layer 26 may be between about 55° and about 89°.

At step 1006, a third IBE process 40 is performed at a low angle of incidence. Step 1006 is illustrated in FIG. 2C as described below.

FIG. 2C illustrates a third IBE process 40 at a low angle of incidence to further pattern the free layer 28. The third IBE process 40 may pattern the free layer 28 to a width that is substantially the same as the top electrode 30, wherein the sidewalls of the free layer 28 are substantially aligned with the sidewalls of the top electrode 30. The details of the third IBE process 40 may be similar to those described above in reference to FIG. 3, although the IBE processes need not be the same. In an embodiment, the angle of incidence of the ion beam as measured from a line orthogonal to a top surface of the barrier layer 26 may be between about 0° and about 25°.

Figure 8:
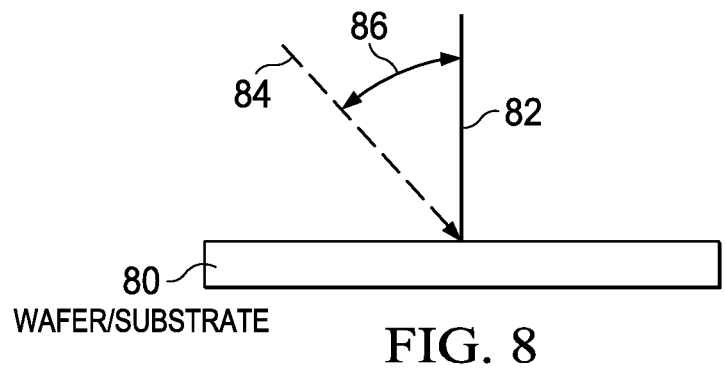
FIG. 8 illustrates the angle of incidence of an ion beam in accordance with an embodiment.

The angle of incidence of the ion beams described above in FIGS. 2A, 2B, and 2C are measured as illustrated in FIG. 8. In FIG. 8, the ion beam 84 is at an angle of incidence 86 as measured from a line 82 that is orthogonal to a top surface of layer 80.

The multi-step IBE etch process described above may also be applied to the patterning of the barrier layer 26, the pinned layer 24, and the AFM layer 22 to remove a film that may be formed on the sidewalls of the MTJ 50. The details of the multi-step IBE etch process were previously described above, and will not be repeated herein.

By performing a multi-step IBE process to pattern the MTJ 50, a film comprising a re-deposition of etch by-product may be removed. This allows for a semiconductor device, for example, an MRAM device, to have improved performance and electrical characteristics.

Various modifications may be made to the above MTJ device 100. The MTJ device 100 may be provided in any orientation or axis, including vertical (as illustrated), horizontal, or angled. Depending on the composition of the various layers and etches used, the order in which certain layers are placed or deposited can be varied. It will also be recognized that the order of layers and the materials forming those layers in the above embodiments are merely exemplary. Moreover, in some embodiments, other layers (not shown) may be placed or deposited and processed to form portions of a MTJ device 100 or to form other structures on a substrate. In other embodiments, these layers may be formed using alternative deposition, patterning, and etching materials and processes, may be placed or deposited in a different order, or composed of different materials, as would be known to one of skill in the art.

An embodiment is a method of forming a magnetic tunnel junction (MTJ) device, the method comprising forming an MTJ layer over a bottom electrode, forming a top electrode layer over the MTJ layer, and selectively etching the top electrode layer to form a top electrode over the MTJ layer. The method further comprises patterning an upper portion of the MTJ layer with an ion beam etch (IBE) process.

Another embodiment is a method of forming a magnetic random access memory (MRAM) device, the method comprising forming a magnetic tunnel junction (MTJ) layer over a bottom electrode, the MTJ layer including a free layer, forming a top electrode layer over the MTJ layer, and etching the top electrode layer to form a top electrode over the MTJ layer. The method further comprises patterning the free layer of the MTJ layer with a multi-step ion beam etching (IBE) process.

Yet another embodiment is a method of forming a magnetic random access memory (MRAM) device, the method comprising forming an anti-ferromagnetic (AFM) layer, forming a pinned layer over the AFM layer, forming a barrier layer over the pinned layer, and forming a free layer over the barrier layer. The method further comprises performing an ion beam etching (IBE) process to pattern the free layer, wherein the IBE process stops on the barrier layer.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a magnetic tunnel junction (MTJ) device, the method comprising:
    forming an MTJ layer over a bottom electrode, the forming the MTJ layer further comprises:
        forming an anti-ferromagnetic (AFM) layer over the bottom electrode;
        forming a pinned layer over the AFM layer;
        forming a barrier layer over the pinned layer; and
        forming a free layer over the barrier layer;
    forming a top electrode layer over the MTJ layer;
    selectively etching the top electrode layer to form a top electrode over the MTJ layer;
    patterning the free layer with an ion beam etch (IBE) process; and
    forming spacers on sides of the top electrode and the free layer, sidewalls of the spacers directly adjoining the top electrode and the free layer, bottom surfaces of the spacers directly adjoining top surfaces of the barrier layer.

2. The method of claim 1, wherein the IBE process stops on the barrier layer.

3. The method of claim 1 further comprising:
    after the forming the spacers, patterning the barrier layer, the pinned layer, and the AFM layer.

4. The method of claim 1, wherein the forming spacers on sides of the top electrode and the free layer further comprises:
    forming a first dielectric layer over the top electrode and the MTJ layer; and
    patterning the first dielectric layer to remove the horizontal surfaces of the first dielectric layer.

5. The method of claim 1 further comprising encapsulating the top electrode, the spacers, the MTJ layer, and the bottom electrode with a second dielectric layer.

6. The method of claim 3, wherein the patterning the barrier layer, the pinned layer, and the AFM layer further comprises performing a second IBE process.

7. A method of forming a magnetic random access memory (MRAM) device, the method comprising:
    forming a magnetic tunnel junction (MTJ) layer over a bottom electrode, the MTJ layer including a free layer;
    forming a top electrode layer over the MTJ layer;
    etching the top electrode layer to form a top electrode over the MTJ layer; and
    patterning the free layer of the MTJ layer with a multi-step ion beam etching (IBE) process, the patterning the free layer of the MTJ layer with a multi-step IBE process further comprises:
        performing a first IBE process on the free layer at a first angle of incidence;
        performing a second IBE process on the free layer at a second angle of incidence, the second angle of incidence being different from the first angle of incidence, the first IBE process forming a film on sidewalls of the top electrode, and the second IBE process removing the film from the sidewalls of the top electrode; and
        performing a third IBE process on the free layer at a third angle of incidence, the third angle of incidence being different from the second angle of incidence.

8. The method of claim 7, wherein the second angle of incidence is larger than the first angle of incidence and the third angle of incidence as measured from a line orthogonal to a top surface of the bottom electrode.

9. The method of claim 7, wherein the first angle of incidence is between about 0 and about 25 as measured from a line orthogonal to a top surface of the bottom electrode, and wherein the second angle of incidence is between about 55 and about 89 as measured from the line orthogonal to the top surface of the bottom electrode.

10. The method of claim 7, wherein the film on the sidewalls of the top electrode comprises a re-deposited etching by-product from the first IBE process.

11. The method of claim 7, wherein the multi-step IBE process comprises an etchant gas from a group consisting essentially of $CHF_2$, $CHF_3$, or $CHF_4$, Ar, O, N, or a combination thereof.

12. The method of claim 7 further comprising forming a dielectric layer over the bottom electrode, the MTJ layer, and the top electrode.

13. A method of forming a magnetic random access memory (MRAM) device, the method comprising:
    forming an anti-ferromagnetic (AFM) layer;
    forming a pinned layer over the AFM layer;
    forming a barrier layer over the pinned layer;
    forming a free layer over the barrier layer;
    performing an ion beam etching (IBE) process to pattern the free layer, wherein the IBE process stops on the barrier layer;
    forming spacers on sidewalls of the free layer; and
    encapsulating the AFM layer, the pinned layer, the barrier layer, and the spacers with a dielectric layer, the dielectric layer directly adjoining the spacers, the barrier layer, and the pinned layer.

14. The method of claim 13, wherein the IBE process is a multi-step IBE process, the multi-step process comprising ions with at least two angle of incidences.

15. The method of claim 13 further comprising patterning the barrier layer, the pinned layer, and the AFM layer, thereby forming a magnetic tunnel junction (MTJ).

16. The method of claim 15 further comprising:
   forming a bottom electrode under the MTJ; and
   forming a top electrode over the MTJ, the dielectric layer encapsulating the top electrode, the MTJ, and the bottom electrode.

17. The method of claim 13, wherein sidewalls of the spacers directly adjoin the free layer and bottom surfaces of the spacers directly adjoin top surfaces of the barrier layer.

18. The method of claim 13 further comprising after the forming the spacers, patterning the barrier layer, the pinned layer, and the AFM layer.

19. The method of claim 1, wherein the patterning the free layer with an IBE process further comprises:
   performing a first IBE process on the free layer at a first angle of incidence; and
   performing a second IBE process on the free layer at a second angle of incidence, the second angle of incidence being different from the first angle of incidence, the first IBE process forming a film on sidewalls of the top electrode, and the second IBE process removing the film from the sidewalls of the top electrode.

20. The method of claim 5, wherein the second dielectric layer directly adjoins the spacers, the barrier layer, and the pinned layer.

* * * * *